United States Patent
Biber et al.

(10) Patent No.: US 9,810,752 B2
(45) Date of Patent: Nov. 7, 2017

(54) DETERMINATION OF A TYPE OF PROCESSING OF SIGNALS TRANSMITTED BY LOCAL COIL

(71) Applicants: Stephan Biber, Erlangen (DE); Jan Bollenbeck, Eggolsheim (DE); Markus Vester, Nürnberg (DE); JianMin Wang, ShenZhen (CN)

(72) Inventors: Stephan Biber, Erlangen (DE); Jan Bollenbeck, Eggolsheim (DE); Markus Vester, Nürnberg (DE); JianMin Wang, ShenZhen (CN)

(73) Assignee: Siemens Aktiengesellschaft, München (DE)

( * ) Notice: Subject to any disclaimer, the term of this patent is extended or adjusted under 35 U.S.C. 154(b) by 429 days.

(21) Appl. No.: 14/483,795

(22) Filed: Sep. 11, 2014

(65) Prior Publication Data

US 2015/0070014 A1 Mar. 12, 2015

(30) Foreign Application Priority Data

Sep. 11, 2013 (DE) .......... 10 2013 218 226

(51) Int. Cl.
| | | |
|---|---|---|
| *G01R 33/341* | (2006.01) | |
| *G01R 33/54* | (2006.01) | |
| *G01R 33/36* | (2006.01) | |
| *G01R 33/385* | (2006.01) | |
| *G01R 33/3415* | (2006.01) | |

(52) U.S. Cl.
CPC ....... *G01R 33/341* (2013.01); *G01R 33/3415* (2013.01); *G01R 33/3621* (2013.01); *G01R 33/3664* (2013.01); *G01R 33/3852* (2013.01); *G01R 33/54* (2013.01)

(58) Field of Classification Search
CPC .. G01R 33/341; G01R 33/3852; G01R 33/54; G01R 33/3621; G01R 33/3664
See application file for complete search history.

(56) References Cited

U.S. PATENT DOCUMENTS

| 5,461,314 A | 10/1995 | Arakawa et al. |
| 6,362,622 B1 * | 3/2002 | Stauber .................. G01R 33/36 324/318 |

(Continued)

FOREIGN PATENT DOCUMENTS

| DE | 102007047022 A1 | 11/2008 |
| DE | 102007026915 B4 | 1/2011 |

(Continued)

OTHER PUBLICATIONS

German office Action for related German Application No. 10 2013 218 226.0 dated Mar. 29, 2016, with English Translation.

(Continued)

*Primary Examiner* — G. M. Hyder
(74) *Attorney, Agent, or Firm* — Lempia Summerfield Katz LLC

(57) ABSTRACT

A method and an apparatus for a magnetic resonance imaging system are provided. A type of further processing of signals transmitted by a local coil to a magnetic resonance imaging (MRI) system is determined in dependence on information received in or from the local coil about a local-coil type of the local coil.

27 Claims, 2 Drawing Sheets

(56) References Cited

U.S. PATENT DOCUMENTS

| | | | |
|---|---|---|---|
| 2008/0246477 A1* | 10/2008 | Nakabayashi | G01R 33/34046 324/312 |
| 2008/0309342 A1 | 12/2008 | Kess | |
| 2009/0286478 A1 | 11/2009 | Biber et al. | |
| 2012/0071117 A1 | 3/2012 | Biber et al. | |

FOREIGN PATENT DOCUMENTS

| | | |
|---|---|---|
| DE | 102008023467 B4 | 6/2012 |
| DE | 102010012395 B4 | 4/2014 |

OTHER PUBLICATIONS

German Office Action cited in German Application No. 10 2013 218 226.0, mailed Mar. 26, 2014, with English Translation., pp. 1-10.
Phillips dStream architecture—the digital revolution in MRI. pp. 1-16. Jan. 2011.

\* cited by examiner

DETERMINATION OF A TYPE OF PROCESSING OF SIGNALS TRANSMITTED BY LOCAL COIL

This application claims the benefit of DE 10 2013 218 226.0, filed on Sep. 11, 2013, which is hereby incorporated by reference in its entirety.

BACKGROUND

The present embodiments relate to apparatuses and methods for magnetic resonance imaging.

Magnetic resonance imaging scanners (MRIs) for examining objects or patients using magnetic resonance imaging are known, for example, from DE 10 2008 023 467.2 relating to an IF transmission with frequency-division multiplex for local coils, from DE 10 2007 047 022.5 relating to a broadband transmission of a plurality of MR signals, from DE 10 2010 012 395.1 relating to an MRI receiving system, and from http://www.healthcare.philips.com/main/about/events/ecr/assets/documents/dStream-whitepaper.pdf.

SUMMARY

The scope of the present invention is defined solely by the appended claims and is not affected to any degree by the statements within this summary.

The present embodiments may obviate one or more of the drawbacks or limitations in the related art. For example, apparatuses and methods for magnetic resonance imaging are optimized.

DETAILED DESCRIPTION

Figure 2:
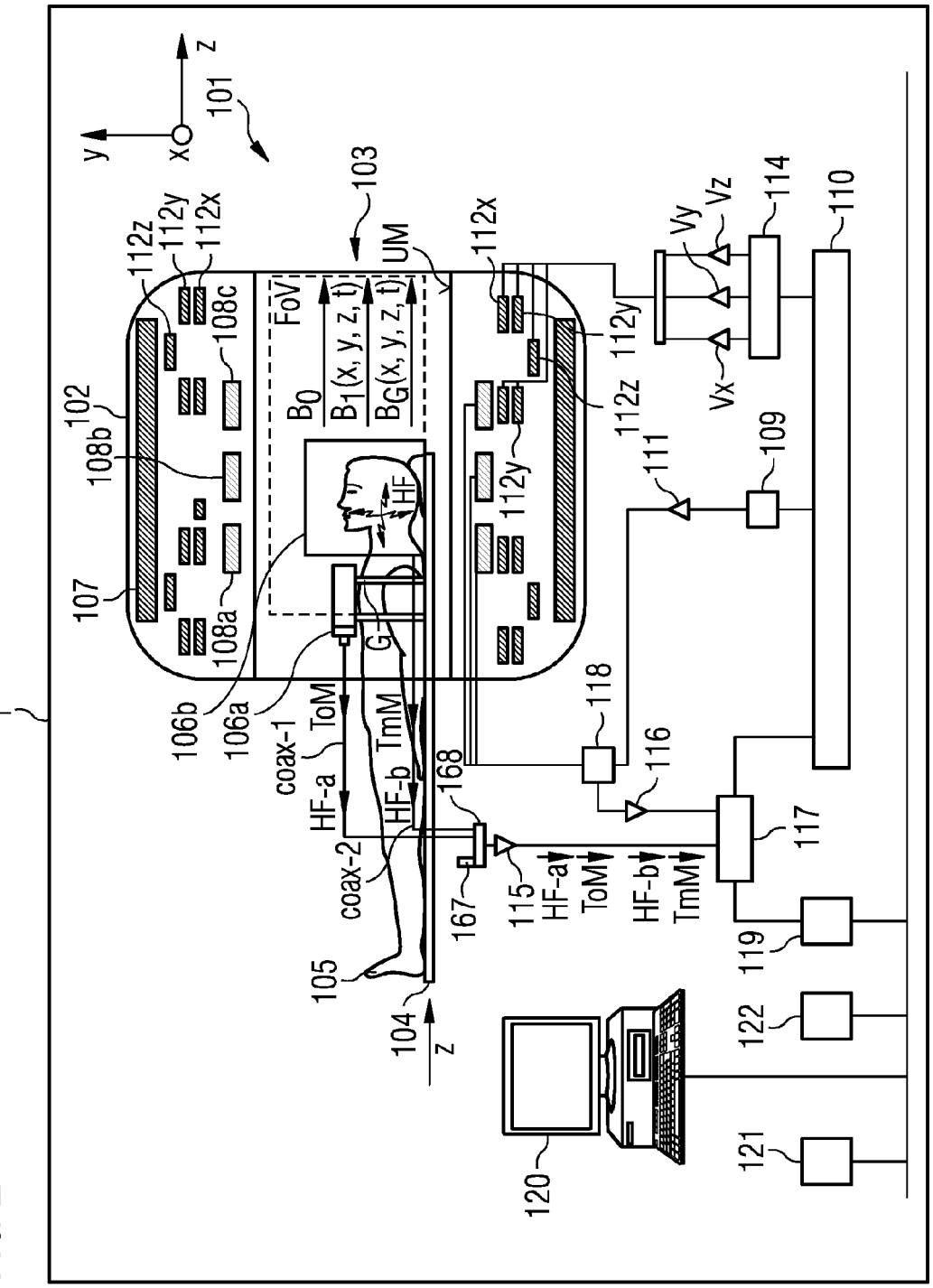
FIG. 2 shows one embodiment of an MRI system.

FIG. 2 illustrates one embodiment of a magnetic resonance imaging (MRI) scanner 101 (e.g., situated in a shielded room or Faraday cage F) with a whole body coil 102 with, for example, a tubular space 103 in which a patient couch 104 with a body of, for example, an examination object 105 (e.g., a patient; with or without local coil arrangement or local coil 106a, 106b) may be displaced in the direction of the arrow z in order to generate recordings of the patient 105 by an imaging method. In this case, two local coil arrangements 106a, 106b (e.g., a head coil 106a and a ribcage coil 106b), by which, in a local region (e.g., a field of view (FOV)) of the MRI scanner, recordings of a portion of the body 105 in the FOV may be generated, are arranged on the patient. Signals RF of the local coil arrangement 106a, 106b may be evaluated (e.g., converted into images, stored or displayed) by an evaluation device (e.g., including elements 168, 115, 117, 119, 120, 121) of the MRI scanner 101 that may be connected to the local coil arrangement 106a, 106b by, for example, coaxial cables coax1, coax2 or by radio link (e.g., element 167).

In order to use a magnetic resonance imaging scanner MRI 101 to examine a body 105 (e.g., an examination object or a patient) using magnetic resonance imaging, different magnetic fields that are precisely matched to one another in terms of temporal and spatial characteristics, are radiated onto the body 105. A strong magnet (e.g., a cryomagnet 107) in a measurement cabin with an opening 103 that is tunnel-shaped in this case generates a strong static main magnetic field $B_0$ that has a strength of, for example, 0.2 Tesla to 3 Tesla or more. A body 105 to be examined is, while supported by a patient couch 104, moved into a region of the main magnetic field $B_0$ that is approximately homogeneous in the observation region FOV. The nuclear spins of atomic nuclei of the body 105 are excited by magnetic radiofrequency excitation pulses B1 (x, y, z, t) of a frequency RF-F that are radiated in by a radiofrequency antenna (and/or, optionally, a local coil arrangement) that is shown in FIG. 2 in a simplified manner as a body coil 108 (e.g., a multi-part body coil 108a, 108b, 108c). By way of example, radiofrequency excitation pulses are generated by a pulse generation unit 109 that is controlled by a pulse sequence control unit 110. After amplification by a radiofrequency amplifier 111, the radiofrequency excitation pulses are conducted to the radiofrequency antenna 108. The radiofrequency system shown in FIG. 2 is merely indicated schematically. In a magnetic resonance imaging scanner 101, more than one pulse generation unit 109, more than one radiofrequency amplifier 111, and a plurality of radiofrequency antennas 108a, b, c may be used.

The magnetic resonance imaging scanner 101 also includes gradient coils 112x, 112y, 112z, by which magnetic gradient fields $B_G$ (x, y, z, t) are radiated in during a measurement for selective slice excitation and for spatial encoding of the measurement signal RF. The gradient coils 112x, 112y, 112z are controlled by a gradient coil control unit 114 (and optionally via amplifiers Vx, Vy, Vz) that, like the pulse generation unit 109, is connected to the pulse sequence control unit 110.

Signals RF emitted by the excited nuclear spins of the atomic nuclei in the examination object are received by the body coil 108 and/or at least one local coil arrangement 106a, 106b, amplified by associated radiofrequency preamplifiers 116, and processed further and digitized by a magnetic resonance imaging system reception signal further processing device 117. The recorded measurement data is digitized and stored as complex numbers in a k-space matrix. An associated MRI image may be reconstructed from the k-space matrix filled with values by a multidimensional Fourier transform. For a local coil that may be operated both in transmission mode and in reception mode, such as, for example, the body coil 108 or a local coil 106a, 106b, the signal is transmitted via an upstream transmission/reception switch 118.

An image processing unit 119 generates an image from the measurement data. The image is displayed to a user by an operating console 120 and/or stored in a storage unit 121. A central computer unit 122 controls the individual installation components.

In MR imaging, images with a high signal-to-noise ratio (SNR) may be recorded using local coil arrangements (e.g., coils, local coils). The local coil arrangements are antenna systems that are attached in the direct vicinity on (e.g., anterior) or under (posterior), at, or in the body 105. During an MR measurement, the excited nuclei induce a voltage in the individual antennas of the local coil. The induced voltage is amplified using a low-noise preamplifier (e.g., LNA, preamp) and transmitted to the reception electronics. In order to improve the signal-to-noise ratio even in the case of high resolution images, high-field installations (e.g., 1.5 T-12 T or more) are used. If more individual antennas may be connected to an MR reception system than receivers are available, a switching matrix (e.g., RCCS), for example, is installed between reception antennas and receivers. The matrix routes the currently active reception channels (e.g., the reception channels that currently lie in the field of view of the magnet) to the available receivers. As a result, more local coil elements than receivers are available may be connected because, in the case of a whole body cover, only the local coils that are situated in the FOV or in the homogeneous volume of the magnet may be read.

By way of example, an antenna system, which may, for example, include one antenna element or, as an array coil, a plurality of antenna elements (e.g., local coil elements), may be referred to as a local coil arrangement 106a, 106b. By way of example, these individual antenna elements are embodied as loop antennas (e.g., loops), butterfly coils, flex coils or saddle coils. By way of example, a local coil arrangement includes local coil elements, a preamplifier, further electronics (e.g., standing wave traps, etc.), a housing, supports and may include a cable with a plug, by which the local coil arrangement is connected to the MRI scanner. A receiver 168 attached to the scanner side filters and digitizes a signal RF received from a local coil 106a, 106b, and transmits the data to a digital signal processing device that may derive an image or spectrum from the data obtained by a measurement and makes the image or spectrum available to the user (e.g., for the subsequent diagnosis by the user and/or for storing).

Figure 1:
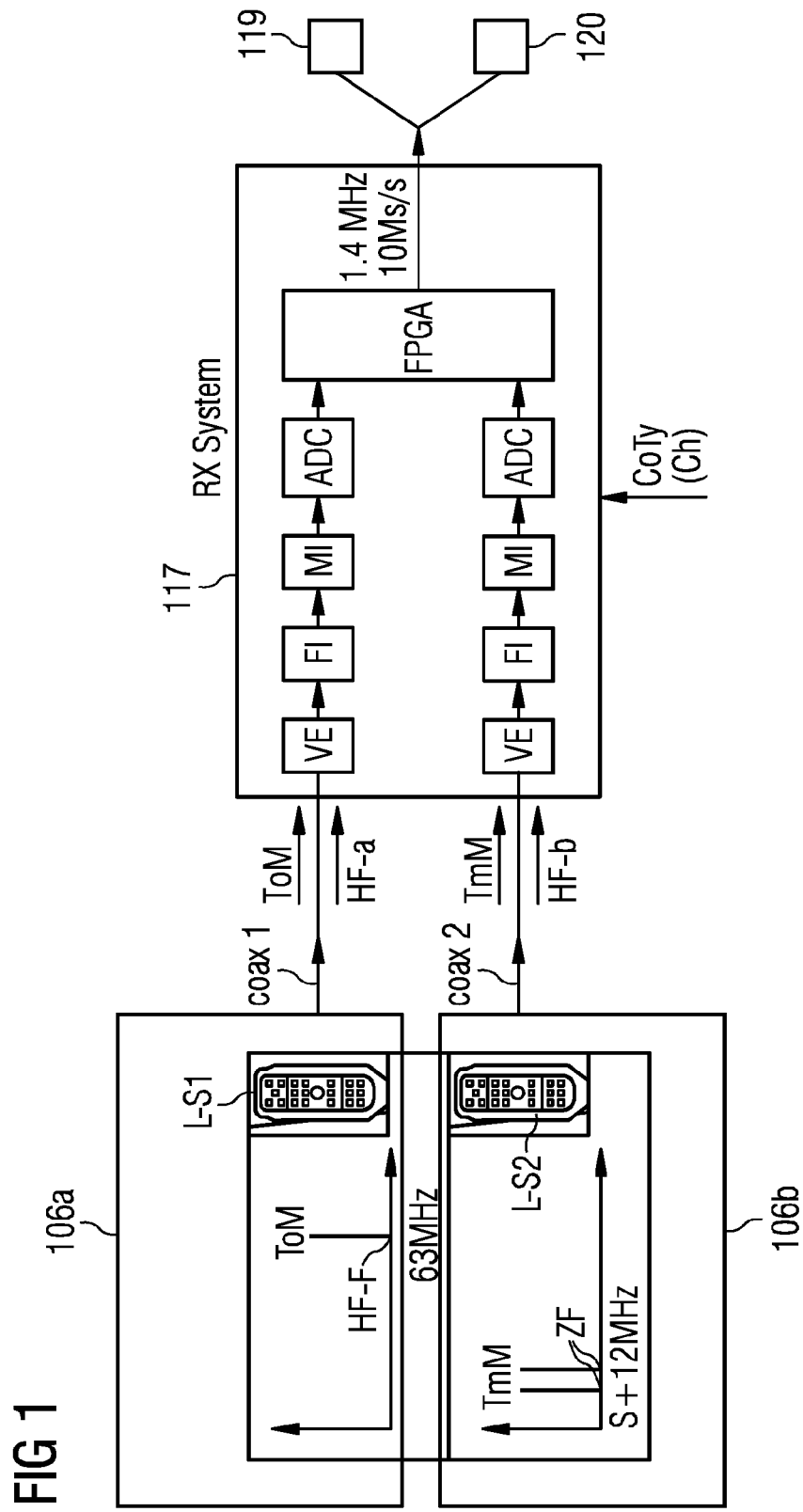
FIG. 1 shows one embodiment of a local coil connected to a magnetic resonance imaging (MRI) system.

FIGS. 1 and 2 schematically illustrate, in a simplified manner, details of exemplary embodiments of apparatuses.

For operating local coils 106a, 106b (e.g., the rib cage coil 106a and the head coil 106b in FIG. 2) in MRI systems 101, various architectures for transmitting signals RF (e.g., received from a patient 105 during an imaging MRI measurement) from a local coil 106a, 106b as a preprocessed signal or non-preprocessed signal (e.g., RF-a, RF-b) to an MRI system 101 are known. A distinction is made, for example, between the coding (e.g., analog/digital) of the information transmitted in signals RF-a, RF-b and the type of transmission of the signals RF-a, RF-b (e.g., electrically/optically). In modern MRI systems 101 from various sellers, including Siemens Aktiengesellschaft, analog-electrical systems and digital-optical methods are used for transmission, and in analog and digital systems, whether the information is transmitted at the original frequency (e.g., of the signals RF received from a local coil) or in an analog or digital manner at an intermediate frequency may also be distinguished between.

With respect to apparatuses that are known under the designation "TIM4G" (and/or TmM-type apparatuses), DE 10 2008 023 467.2 describes apparatuses and methods for converting the RF signal RF of the MR reception antenna to an intermediate frequency IF, which may offer multifarious advantages. In order to be able to connect ToM local coils 106 (e.g., a ToM local-coil type may be a local-coil type without mixing in an intermediate frequency range and/or a TIM system) that transmit, for example, reception (RX) signals RF at the radio frequency of an MRI system 101 (e.g., the Larmor frequency of the MRI system 101) to the MRI system 101, TmM local coils 106b (e.g., a TmM local-coil type may be a local-coil type with mixing in an intermediate frequency range and/or a TIM4G system) and/or systems with, for example, conversion of the RF signal RF of the MR local coil 106b to an intermediate frequency, and/or other systems, adapter solutions that both establish mechanical compatibility (e.g., various plug-connection systems) and carry out the conversion of the RF signal RF to an intermediate frequency IF have been developed. Such an adapter thus enables backward-compatibility of the local coil interface.

A mechanical compatibility of various types of ToM, TmM ToM local coils 106a, 106b may be implemented by retrofitting the plug (e.g., retrofitting the plugs used for local coils of various local-coil types (CoTy), such as ToM plugs on TmM plugs).

One aspect of configurations according to one or more of the present embodiments is the compatibility of the transmission techniques for various local-coil types such as, for example, ToM (e.g., a local-coil type without mixing in an intermediate frequency range), TmM (e.g., a local-coil type with mixing in an intermediate frequency range) or any desired others. The following features may be present.

A reception system (e.g., an RX system; the magnetic resonance imaging system reception signal further processing device 117 (i.e., processor)) of an MRI system (e.g., including elements 101 and 117) receives (e.g., via cable 168 or by radio link 167) an item of information (e.g., "ToM" or "TmM" or other) about the connected local coil type (e.g., ToM, TmM) from at least one local coil 106a, 106b. Signals (e.g., RF-a from a local coil 106a of the type ToM and/or signals RF-b from a local coil 106b of the type TmM and/or other) that are received by the MRI system 101, 117 (e.g., during imaging using the MRI scanner 101 of the patient 105) and passed on, are further processed in different ways, if appropriate, depending on the local-coil type and thus possibly the signal type (e.g., RF transmission/IF intermediate frequency transmission of the signals RF-a, RF-b).

Typical settings that may be set in the MRI system 101, 117 (e.g., in a module FPGA that further processes radio-frequency signals RF-a, RF-b) under certain circumstances, in dependence on the information ToM, TmM about the local-coil type (e.g., ToM, TmM or other) are, for example: settings of the analog postprocessing of the signals RF-a, RF-b outside the local coil (i.e., in the MR system 117, 101); settings of filters (e.g., connecting, switching, disconnecting, detuning) in the MRI system 101, 117, connecting/disconnecting of local oscillator signals (e.g., for converting signals RF-a, RF-b; according to DE 10 2008 023 467.2, which is hereby fully incorporated by reference), which are transmitted at intermediate frequencies IF, to other frequencies; settings of amplifications or attenuations for balancing gain between two concepts; settings of analog compression properties; settings of an analog multiplexer (e.g., with respect to a multiplex frequency; if signals RF-a are transmitted in the frequency multiplex from a local coil 106a to a device such as 168 and/or 167 and/or 117) of the MRI scanner 101; settings of the sample rate of an analog/digital converter ADC; and/or settings of the digital postprocessing (e.g., after digitization) of signals RF-a, RF-b such as, for example, an expansion in the case of a preceding analog compression, a frequency conversion by mixing with a numeric controlled oscillator (NCO) signal, a decimation, and/or a change in the frequency position of a digital IF signal RF-b (e.g., from a normal position or inverted position).

The information (e.g., "ToM," "TmM"), about which local-coil type (e.g., ToM, TmM or other) is present, may be transported (e.g., using an analog code or a digital code that is implemented or stored in the local coil 106a, 106b) to a device (e.g., 168 and/or 167 and/or 117) of the MRI scanner 101, and/or be stored in a file in the MRI scanner 101 (e.g., in a magnetic resonance imaging system reception signal further processing device 117), to which an information item in the local coil 106a, 106b refers. In addition to analog and digital coding options, coding via short-circuit plugs, RFIDs or other variants at an interface (e.g., L-S1, L-S2) may also be provided. In dependence on local-coil codes or on a file that refers to a code, the MRI system 101, 117 may identify which local-coil type (e.g., ToM, TmM, etc.) is present, and may then decide, for example, which one of the parameters that are mentioned above (e.g., with respect to the further processing (ADC, FPGA, VE, FI, MI) of the signals RF-a, RF-b in the MRI system 101, 117)) is set and how. It is also possible to differentiate between more than two local-coil types ToM, TmM, etc.

In the case of the combination of an RF architecture with an IF architecture (i.e., in FIG. 1, of a transmission of signals RF-a at the RF frequency of 63 MHz of the MRI scanner 101, 108*a*-*c* and of a transmission of signals RF-b at one or more intermediate frequencies IF of 8 MHz and 12 MHz, which differ from the RF frequency of the MRI scanner 101, 108*a*-*c*), a receiver that may process both frequency bands may be a reception system that may be implemented as a direct receiver, a superheterodyne reception system, as a double superheterodyne reception system or as a multiple superheterodyne reception system.

One aspect is the availability of the information (ToM, TmM etc.) about the local-coil type of a local coil 106*a*, 106*b* connected to the MRI system 101, 117, and the ability of a receiver (e.g., the magnetic resonance imaging system reception signal further processing device 117) to handle various frequency bands, frequency positions (e.g., inverted position, normal position) and various amplitudes. There is also the option of using local coils 106*a*, 106*b* of various local-coil types ToM, TmM in the same measurement (e.g., at the same time). A DS receiver as in FIG. 1 may, for example, also process signals RF-a, RF-b from local coils of various local-coil types ToM, TmM during the same imaging MRI measurement.

In one or more of the present embodiments, the infrastructure required by the various local-coil types ToM, TmM may also be available at the local coil interface (L-S). For example, if the electronics of a local coil of a local-coil type (e.g., ToM) use 10 V as supply for electronics, but the electronics of a local coil of a different local-coil type (e.g., TmM) uses 3 V, both voltages may be made available in parallel (e.g., at least at one interface L-S1 and LS2 at the MRI scanner 117, 101) or be set correspondingly in dependence on the local-coil type (e.g., ToM, TmM, etc.).

If the identification of a local-coil type ToM, TmM itself requires the presence of a voltage, the voltage may be made available as auxiliary voltage, and the actual electronics operational voltage may be connected later. If detuning circuits in the various local-coil types (e.g., ToM, TmM, etc.) have different requirements of the MRI system (e.g., with respect to current/voltage/switching speed), this may also be stored as information (e.g., in a coilfile or coilcode), and the MRI system may react accordingly.

One advantage may be a configuration of an MR reception system and control system that provides a multi-mode local-coil interface that is compatible with different local-coil signal transmission methods. This may permit backward compatibility with "old" local coils 106*a*, 106*b* even without the use of additional adapter plugs, for which no space for backward compatibility may even be available on a patient couch or which may have disadvantages in terms of workflow and cost.

According to one or more of the present embodiments, systems (e.g., "ToM") having an RF Larmor frequency transmission and/or in which the active local-coil electronics include only an LNA may, for example, be used with systems (e.g., "TmM") having an intermediate frequency (IF) transmission with frequency division multiplex FDM, active local-coil electronics consisting of LNA, mixers and FDM combiners, etc. in an MRI scanner.

Further processing of signals (e.g., received from an examination object with a local coil) on the receiving side that may be activated in dependence on the coil type ToM, TmM, may include, for example, the decision relating to the processing of signals with an analog/digital converter ADC and/or an FPGA and/or analog components such as, for example, pre-amplification and/or amplification VE, filtering FI and/or mixing MI.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus for a magnetic resonance imaging system, the apparatus comprising:
a processor configured to determine, based on information received from a local coil about a local-coil type of the local coil, in the magnetic resonance imaging system, a type of processing of signals transmitted by the local coil to a part of the magnetic resonance imaging system, the type of processing of the signals being related to a preprocessing on a transmission mode.

2. The apparatus of claim 1, wherein the apparatus is a magnetic resonance imaging system reception signal further processing device.

3. The apparatus of claim 1, wherein the processor is further configured to determine, based on the information received in or from the local coil about the local-coil type of the local coil, which relates to a signal type of RF reception signals transmitted by the local coil to the magnetic resonance imaging system, a type of further processing of signals received from the local coil.

4. The apparatus of claim 1, wherein the processor is further configured to determine, based on the information received in or from the local coil about the local-coil type of the local coil, with respect to the transmission of signals of the local coil to the magnetic resonance imaging system either at a Larmor frequency of the magnetic resonance imaging system or at least one intermediate frequency deviating from the Larmor frequency, a type of further processing of signals received from the local coil.

5. The apparatus of claim 1, wherein the processor is further configured to determine, based on the information received in or from the local coil about the local-coil type of the local coil as to whether the local coil has no mixer, has no FDM combiner, or has no mixer or FDM combiner, or whether the local has a mixer, has an FDM combiner, or has a mixer and an FDM combiner, a type of further processing of signals received from the local coil.

6. The apparatus of claim 1, wherein the processor is further configured to determine, based on the information received in or from the local coil about the local-coil type of the local coil, the type of the processing of the signals received from the local coil as to whether analog postprocessing of the signals is carried out outside the local coil in the magnetic resonance imaging system.

7. The apparatus of claim 1, wherein the processor is further configured to determine, based on the information received in or from the local coil about the local-coil type of the local coil, the type of the processing of the signals received from the local coil as to whether filters for filtering the signals should be connected, switched, disconnected, detuned, or a combination thereof.

8. The apparatus of claim 1, wherein the processor is further configured to determine, based on the information received in or from the local coil about the local-coil type of the local coil, the type of the processing of the signals received from the local coil as to whether local oscillators should be connected, disconnected, or connected and disconnected.

9. The apparatus of claim 1, wherein the processor is further configured to determine, based on the information received in or from the local coil about the local-coil type of the local coil, the type of the processing of the signals received from the local coil as to whether amplifications or attenuations for balancing gain should be provided.

10. The apparatus of claim 1, wherein the processor is further configured to determine, based on the information received in or from the local coil about the local-coil type of the local coil, the type of the processing of the signals received from the local coil as to whether analog compression properties should be provided for compression or decompression of the signals, which analog compression properties should be provided for compression or decompression of the signals, or a combination thereof.

11. The apparatus of claim 1, wherein the processor is configured to determine, based on the information received in or from the local coil about the local-coil type of the local coil, the type of the processing of the signals received from the local coil as to which settings of an analog multiplexer, a mixer, or the analog multiplexer and the mixer are to be provided with respect to the multiplex frequency.

12. The apparatus of claim 1, wherein the processor is further configured to determine, based on the information received in or from the local coil about the local-coil type of the local coil, the type of the processing of the signals received from the local coil as to which sample rate or sampling rate should be chosen in an analog/digital converter for the signals.

13. The apparatus of claim 1, wherein the processor is further configured to determine, based on the information received in or from the local coil about the local-coil type of the local coil, the type of the processing of the signals received from the local coil with respect to settings of digital postprocessing of the signals after an analog/digital conversion.

14. The apparatus of claim 1, wherein the processor is further configured to determine, based on the information received in or from the local coil about the local-coil type of the local coil, the type of the processing of the signals received from the local coil with respect to an expansion in the case of a preceding analog compression.

15. The apparatus of claim 1, wherein the processor is further configured to determine, based on the information received in or from the local coil about the local-coil type of the local coil, the type of the processing of the signals received from the local coil with respect to a frequency conversion by mixing with a numeric controlled oscillator signal.

16. The apparatus of claim 1, wherein the processor is further configured to determine, based on the information received in or from the local coil about the local-coil type of the local coil, the type of the processing of the signals received from the local coil with respect to a decimation using a decimation filter.

17. The apparatus of claim 1, wherein the processor is further configured to determine, based on the information received in or from the local coil about the local-coil type of the local coil, the type of the processing of the signals received from the local coil with respect to a change in a frequency position of the signals received as an intermediate frequency signal in a normal position or inverted position.

18. The apparatus of claim 1, wherein the information is received from the local coil about the local-coil type of the local coil as analog code or as digital code.

19. The apparatus of claim 1, wherein the information about the local-coil type of the local coil is received from the local coil as code, on the basis of which details about the type of the further processing of the signals received from the local coil are retrieved in a memory in the magnetic resonance imaging system.

20. The apparatus of claim 1, wherein the information about the local-coil type of the local coil is received from the local coil on account of coding of a plug or a socket at the local coil in the form of one or more short-circuit plugs at an interface.

21. The apparatus of claim 1, wherein the information about the local-coil type of the local coil is received from the local coil in the form of identifying information received by radio link of RFID tags from the local coil.

22. The apparatus of claim 1, wherein the magnetic resonance imaging system is operable with more than two different local-coil types of local coils.

23. The apparatus of claim 1, wherein in a same measurement, at a same time, a plurality of local coils of different local-coil types are useable in the magnetic resonance imaging system.

24. The apparatus of claim 1, wherein, based on the local-coil type of the local coil, a specific supply voltage is made available at a local-coil interface of the local coil.

25. The apparatus of claim 1, wherein when detuning circuits in different local-coil types have different requirements of the magnetic resonance imaging system with respect to current, voltage, switching speed, or a combination thereof, the magnetic resonance imaging system configures a local-coil interface of the local coil according to the requirements.

26. The apparatus of claim 1, wherein the signals are non-preprocessed or preprocessed RF reception signals that emerged in the local coil from an object to be examined and were received during a magnetic resonance imaging of the magnetic resonance imaging system.

27. A method for magnetic resonance imaging with a local coil, the method comprising:
determining, in a receiver of a magnetic resonance imaging (MRI) scanner, a type of processing of signals received from the local coil based on information received from the local coil about a local-coil type of the local coil, the type of processing of the signals being related to a preprocessing on a transmission mode.

* * * * *